United States Patent [19]

Dodd et al.

[11] Patent Number: 5,009,724
[45] Date of Patent: Apr. 23, 1991

[54] SOLDERING FLUX AND METHOD OF ITS USE IN FABRICATING AND ASSEMBLING CIRCUIT BOARDS

[75] Inventors: Courtney V. Dodd, Oklahoma City, Okla.; Gregory C. Munie, Naperville, Ill.

[73] Assignee: AT&T Bell Laboratories, Murray Hill, N.J.

[21] Appl. No.: 546,646

[22] Filed: Jul. 2, 1990

[51] Int. Cl.$^5$ .............................................. B23K 35/34
[52] U.S. Cl. ...................................... 148/23; 228/207
[58] Field of Search ................................. 148/23–25; 228/207

[56] References Cited

U.S. PATENT DOCUMENTS

| | | | |
|---|---|---|---|
| 2,806,808 | 9/1957 | Muetzel | 148/23 |
| 3,158,120 | 11/1964 | Von Hessert | 148/23 |
| 4,342,607 | 8/1982 | Zado | 148/23 |
| 4,441,938 | 4/1984 | Poliak | 148/23 |
| 4,478,650 | 10/1984 | Zado | 148/23 |
| 4,561,913 | 12/1985 | Zado | 148/23 |
| 4,762,573 | 8/1988 | Biverstedt | 148/23 |

*Primary Examiner*—Peter D. Rosenberg
*Attorney, Agent, or Firm*—Robert B. Levy

[57] ABSTRACT

A water-soluble soldering flux which does not adversely impact the surface insulation resistance of a circuit board is comprised of a water-soluble vehicle, an activator and a hydrophobic surfactant preferentially adsorbed at the board surface. At soldering temperatures, the activator reacts to clean metallized areas on a circuit board and promote solder wetting. The hydrophobic surfactant, which is preferentially adsorbed at the board surface, acts to block the diffusion of hydrophilic vehicle molecules into the board which would otherwise degrade the board's surface insulation resistance.

18 Claims, No Drawings

SOLDERING FLUX AND METHOD OF ITS USE IN FABRICATING AND ASSEMBLING CIRCUIT BOARDS

TECHNICAL FIELD

This invention relates generally to a water-soluble soldering flux of the type used in connection with soldering circuit boards.

BACKGROUND OF THE INVENTION

The process of circuit board assembly is generally carried out by first establishing metallized areas (e.g., copper) on a substrate of FR-4 or the like to establish a circuit pattern and thereafter applying a solder mask to the board to cover those metallized areas which are to be protected from further processing. Such a solder mask generally comprises a polymeric film or layer which is conformally applied to the circuit board. The layer is then patterned, typically by photolithographic techniques, to expose the metallized areas on the circuit board which are to be solder coated. Next, a fusing fluid (soldering flux) is applied to the circuit board to wet and clean the metallized areas. Following application of the flux, the metallized areas are then coated with solder, usually by dipping the board in a molten solder bath. Upon removal from the solder bath, the cicuit board is usually subjected to an air knife which levels the solder to reduce the incidence of solder "icicles" and other related defects such as excess (and unwanted) solder and solder between paths (i.e., solder crosses and shorts). This process is known in the industry as "Hot Air Solder Leveling" (HASL).

Instead of employing the HASL process to coat the selected metallized areas on the board with solder, solder may instead be electroplated over the copper metallized areas. Following electroplating of the solder, flux is sometimes applied to the plated solder before the circuit board is subjected to heating in an oven to reflow the solder. Hereinafter, the term "coating process" will be used generically to describe the process of coating selected metallized areas on the circuit board with solder, such as by the HASL process or by solder electroplating followed by solder reflow.

Because of environmental concerns, water-soluble fluxes, rather than rosin fluxes, are now being used during the coating process. The residues of water-soluble fluxes can be easily cleaned from the circuit board with and/or detergents. In contrast, rosin flux residues generally must be cleaned with chlorofluorocarbon or halogenated hydrocarbon solvents which are deleterious to the environment.

While water-soluble fluxes offer the advantage of aqueous cleaning, such fluxes do posses a disadvantage as compared to rosin fluxes. Present day water-soluble fluxes usually contain water-soluble polyglycols which are hydrophilic. When molten solder is applied to the circuit board, the board (which is comprised of a polymer matrix) is invariably heated above the glass transition temperature $T_g$ of the polymer matrix. During the interval the circuit board is heated above $T_g$, the polyglycol molecules of the water-soluble flux can and do diffuse into the polymer matrix of the circuit board. Once the circuit board cools, the diffused polyglycol molecules become trapped and remain in the board even after cleaning. At very high humidity, the trapped polyglycol molecules will attract water to the surface of the circuit board, lowering the board's Surface Insulation Resistance (SIR).

When a circuit board having polyglycol molecules trapped within its matrix is subjected to a subsequent soldering operation (e.g., to bond components to the board), additional polyglycol molecules may be trapped if water-soluble flux is again used during such soldering. As a result, the SIR of the circuit board may be further reduced until a "saturation level" is reached at which there is no further SIR reduction. At the saturation level, the number of trapped polyglycol molecules is sufficient to attract a continuous film of water molecules.

Reduction of the SIR of the circuit board is undesirable since a reduction in the SIR can adversely affect the input impedance of certain types of integrated circuits, such as operational amplifiers and the like, mounted to the board. For this reason, electronic equipment purchasers often demand that the circuit boards within the equipment they purchase meet or exceed a certain minimum SIR level, typically 3000 megohms. To date, achieving high SIR levels with water-soluble fluxes has proven virtually impossible because of the trapping of polyglycol molecules in the matrix of the circuit board during the soldering process.

Thus, there is a need for a soldering flux which may be cleaned with water and/or detergents, yet does not adversely impact the SIR of a circuit board.

SUMMARY OF THE INVENTION

Briefly, in accordance with the invention, a soldering flux is disclosed which is both water-soluble and which does not degrade the SIR of a polymer matrix substrate, such as a circuit board, after aqueous cleaning. The flux is comprised of an activator, a hydrophobic surfactant which is preferentially absorbed by the surface of the circuit board to render the surface substantially hydrophobic, and a water-soluble vehicle for carrying the activator and the hydrophobic surfactant to the surface of the board. The activator and vehicle are chosen to act in a fashion similar to a conventional water-soluble flux to wet and clean metallized areas on the circuit board toi facilitate soldering. The hydrophobic surfactant, which is chosen for its preferential adsorption, acts to fill the interstices in the of the substrate when the circuit board is heated above $T_g$ (the glass transition temperature of the polymer matrix of the board) during soldering to prevent the vehicle molecules, which are typically hydrophilic, from being trapped. An inert oil may be added to the flux to increase the post-soldering hydrophobicity of the circuit board and thereby maintain the value of the board's SIR. To aid in the liquid handling characteristics of the flux, a solvent is often, although not always, used to solubilize the above constituent components.

DETAILED DESCRIPTION

The present invention is directed to a soldering flux for use on circuit boards during the coating process (e.g., HASL or the reflow of electroplated solder) as well as during subsequent soldering of electronic components to the board. As will be further described below, the flux of the invention is water soluble, allowing for easy cleaning of residues with water and/or detergents, yet the flux does not substantially lower the surface insulation resistance (SIR) of the circuit board.

The flux of the invention is comprised of an activator, a hydrophobic surfactant which is preferentially adsorbed by the surface of the circuit board to render the surface substantially hydrophobic, and a water-soluble vehicle for carrying the surfactant and the activator. To increase the hydrophobicity of the circuit board following soldering, an inert oil may be added to the flux. Application of the flux to a circuit board can be facilitated by dissolving the activator, the hydrophobic surfactant, the vehicle and the inert oil in a solvent, such as isopropyl alcohol or the like.

The activator within the flux of the invention can be drawn from those classes of materials that act as oxide reducing agents, wetting agents for the molten solder, and/or metal complexing agents. Examples of these materials (but not limited to them) are amine hydrohalides, organic acids and free amines. For water-soluble fluxes, activators of the organic acid variety are generally drawn from one or more of the group of low molecular weight (i.e., water-soluble) acids, e.g., citric, levulinic, acetic or oxalic acids. When any one of these acids (or a mixture thereof) is employed as the activator, the acid(s) will constitute between 0–20% by weight of the flux. The metal complexing agents may be simple amines, such as ethylamine, or they may be a chelating agent, such as ethylene diamine tetra-acetic acid. The metal complexing-type activators constitute between 0–5% by weight of the flux. The oxide reducing agents are generally drawn from the class of amine hydrohalides, typically with chlorine or bromine as the halide. The oxide reducing agents typically constitute 0–10% by weight of the flux.

The vehicle of the instant flux is chosen to be water-soluble and nonionic. Typically, the vehicle comprises a pure polyethylene or polypropylene glycol or a surfactant that has either a polyethylene glycol (polyethoxylate) or polypropylene glycol (polypropoxylate) chain as its hydrophilic portion. The vehicle generally comprises 10 to 50% by weight of the flux.

As discussed above, printed circuit boards are generally comprised of a polymer matrix, which, during soldering, is usually heated above its transition glass temperature $T_g$. When a conventional water-soluble flux is applied to the circuit board during soldering, some of the hydrophilic polyglycol molecules in the flux tend to fill the interstices in the matrix of the board created when the board is heated above $T_g$. Once the circuit board cools, the hydrophilic polyglycol molecules become trapped and remain in the matrix of the board, even after cleaning. The trapped hydrophilic polyglycol molecules tend to attract water to the surface of the circuit board under conditions of high humidity, reducing the board's SIR.

To avoid this result, the flux of the present invention advantageously includes a hydrophobic surfactant comprised of either a mono-, di- or tri-alkyl or -aryl phosphate ester (or mixture thereof).

Typically, the hydrophobic group of the surfactant is chosen from one of the following classes:

(a) straight or branched carbon chains containing an alkyl group in which the molecular weight of the alkyl chain is greater than 48;

(b) straight or branched carbon chains containing an aryl chain in which the weight of the chain is greater than 189;

(c) straight or branch chain hydrophobes (alkyl and-/or aryl groups) connected to the phosphate group by one or more polyethylene oxide or polypropylene oxide chains. In the case of a polyethylene oxide chain, its content must be kept to a minimum while the chain of alkyl and aryl groups should be in excess of 48 and 189, respectively, as set forth above. For the polypropylene oxide, there may be up to 5 glycol units for alkyl and aryl groups having a minimum molecular weight of 48 and 189, respectively. Increasing the polypropylene oxide chain requires a corresponding increase in the size of the alkyl and aryl chains to maintain the same SIR level.

The quantity of the hydrophobic surfactant is chosen to be between 0.5–7.1% by weight of the flux. The exact proportions are determined by the hydrophobic nature of the surfactant and the desired level of SIR, as well as the effects of the surfactant ester on other parameters associated with circuit board assembly, such as the solvent extract conductivity.

To increase the hydrophobicity of the circuit board following soldering, we have found it useful to add a small amount of an inert oil to the flux in an amount of 0–2% by weight. Higher levels of inert oil have been found to be generally undesirable because such levels adversely impact the cosmetic appearance of the circuit board, and detrimentally impact its handling and testing. Typically, the inert oil is chosen from the tall oil or light mineral oil group.

Alternatively, the inert oil may be comprised a low level ($\leq 1\%$) of rosin (abietic acid, isomers of abietic acid, and mixtures of those isomers or dimers of abietic acid and the isomers thereof). When employing rosin as the inert oil, the rosin content should be maintained at a sufficiently low level so that no significant rosin residues remain following water cleaning of the board after soldering. Significant residues are defined as those which adversely impact testing of the circuit board or which present a cosmetically unacceptable appearance after cleaning.

To facilitate application of the flux of the invention to a circuit board, the activator, vehicle, hydrophobic surfactant and inert oil can be dissolved in a solvent such as isopropyl alcohol.

Listed below in Table I is a first class of embodiments of the flux of the present invention, indicating the relative surface insulation resistance (as given by the $\log_{10}$ value) for different types and concentrations of hydrophobic surfactants mixed in commercial water-soluble flux containing approximately 10–50% by weight of vehicle and between 0–20% by weight of activator. For the embodiments listed in Table I, the flux was chosen to be LONCO NF 3000 water-soluble flux, available from London Chemical Co., Bensenville, Ill.

The CRODAFOS, EMPHOS, WITCO, MONAFAX, AND ANTARA brands of surfactants are available from the following sources:

| | |
|---|---|
| CRODAFOS | Croda Corp., New York, New York |
| EMPHOS | Witco Chemical, New York, New York |
| MONAFAX | Mona Industries, Paterson, New Jersey |
| ANTARA and GAFAC | Rhone-Poulenc Inc., Princeton, New Jersey |

TABLE I

| Hydrophobic Surfactant Description | Conc. by Weight | Average ($\log_{10}$) Surface Insulation Resistance | (mg-NaCl/in$^2$) Solvent Extract Conductivity | Inert Oil Conc. by Wt. |
|---|---|---|---|---|
| POLYGLYCOL HYDROPHOBES CONTAINING AN ARYL GROUP | | | | |
| GAFAC RM-410 (poly(oxy-1,2-ethanediyl)-α-dinonylphenyl-Ω-hydroxy phosphate) | 2.6% | 8.9 | 0.0067 | 1% rosin |
| NONPOLYGLYCOL HYDROPHOBES CONTAINING ONLY ALKYL GROUPS | | | | |
| EMPHOS PS-400 (a mixture of C8–C10 alkyl phosphates) | 7.1% | 8.8 | not tested | 0.6% rosin |
| EMPHOS PS-400 | 1.2% | 10.0 | 0.0054 | 0.5% tall oil |
| MONAFAX 939 (a mixture of aliphatic phosphates) | 4.9% | 10.4 | 0.0153 | 1.1% tall oil |
| tris-(2-ethylhexyl)-phosphate | 2.1% | 8.2 | 0.0051 | 1.0% rosin |
| POLYGLYCOL HYDROPHOBES CONTAINING ONLY ALKYL GROUPS | | | | |
| CRODAFOS N3 acid (a mixture of 35–45% mono-, 50–60% di-phosphate ester in which the hydrophobic chain consists of a C-18 group attached to the phosphate group by a chain of three ethylene oxide groups) | 2.4% | 9.0 | 0.0081 | 1% rosin |
| CRODAFOS CAP (a mixture of 75% mono-, 25% di-phosphate ester in which the hydrophobic chain consists of a C-16 group attached to the phosphate group by a chain of ten propylene oxide groups) | 0.5% | 8.8 | 0.0081 | none |
| GAFAC RS-410 (poly(oxy, 1,2-ethanediyl),-α-tridecyl-Ω-hydroxy phosphate) | 2.0% | 9.0 | 0.0083 | 1% rosin |
| OTHER | | | | |
| ANTARA LE-500 (a mixture of phosphate esters) | 2.4% | 8.3 | 0.0079 | 1% rosin |

As compared to each of the embodiments of the flux of the invention listed in Table I above, LONCO NF 3000 brand water-soluble flux, by itself, has been found to yield a $\log_{10}$ SIR value of between 7 and 8. Thus, each of the various flux embodiments of the present invention in Table I (obtained by "doping" LONCO NF 3000 flux with a different hydrophobic surfactant) affords at least an order of magnitude greater SIR than the LONCO NF 3000 flux by itself.

The flux of the present invention need not necessarily be obtained by doping LONCO NF 3000 flux in the manner set forth in Table I. Table II lists several examples of the flux of the invention which contain various types of vehicle and activators.

TABLE II

| Mixture | SIR |
|---|---|
| 21% IGEPAL, 0.5% each diethanolamine hydrochloride and diethanolamine hydrobromide, 0.5% white-water rosin, 2% CRODAFOS CAP, 76.5% isopropyl alcohol | 8.5 |
| 20% IGEPAL, 1% diethanolamine hydrobromide, 1% CRODAFOS CAP, 78% isopropyl alcohol | 8.4 |
| 10% PLURACOL, 5% diethanolamine hydrochloride, 6% levulinic acid, 4% of the tridecyl acid phosphate mix, 75% isopropyl alcohol | 9.9 |
| 50% PLURACOL, 3% diethanolamine hydrobromide, 1% Tall oil, 2% CRODAFOS CAP, 43% isopropyl alcohol | 9.7 |

The various embodiments of the flux of the invention listed in Table II, like those in Table I, exhibit a $\log_{10}$ SIR value above 8, and thus represent a significant improvement over conventional water-soluble flux. As compared to the embodiments in Table I, most of the embodiments in Table II, and especially those containing inert oil, were found to exhibit residues even after detergent cleaning. For cosmetic appearances, such residues may be undesirable. IGEPAL and PLURACOL are brands of polyglycol available from Rhone-Poulenc, Princeton, N.J., and BASF, Parsippany, N.J. respectively.

The flux of the invention is well suited for use in the coating processes described previously during which solder is applied to metallized areas on a circuit board, such as by either the HASL process or by electroplating solder to the board. The flux of the invention is applied to the circuit board after the patterning of the photodefinable layer but prior to solder reflow. After the soldering process, the board can be washed with water and/or detergent to remove any remaining residues. With the presence in the instant flux of the hydrophobic surfactant, few if any of the polyglycol molecules of the vehicle become trapped in the board.

Further, the flux of the invention can also be used during the process of solder-bonding components to the circuit board. Typically, this process is carried out by first inserting each component's leads through metal-plated through holes in the board and then subjecting the board to a soldering operation (reflow or wave soldering). The flux of the present invention is applied, typically by brushing, spraying or foaming the flux on the circuit board after component insertion but prior to soldering. Following soldering, the circuit board is typically cleaned with water and/or detergents to remove and flux residues.

The foregoing describes a water-soluble flux which may be easily cleaned from a circuit board with water or detergents, owing to its water-soluble vehicle. Advantageously, the flux does not substantially degrade the board's SIR because of the presence of a hydrophobic surfactant in the flux which is preferentially adsorbed by the board surface to render the surface hydrophobic.

It is to be understood that the above-described embodiments are merely illustrative of the principles of the invention. Various modifications and changes may be made thereto by those skilled in the art which will embody the principles of the invention and fall within the spirit and scope thereof.

What is claimed is:

1. A water-soluble soldering flux, which, when applied to a circuit board, does not degrade the surface insulation resistance of the board following the soldering and subsequent cleaning thereof, comprising:
    a water-soluble vehicle;
    an activator; and
    a hydrophobic surfactant which is preferentially adsorbed by the surface of the circuit board over the vehicle and the activator to render the surface substantially hydrophobic.

2. The flux according to claim 1 further including an inert oil to increase the post-soldering hydrophobicity of the circuit board.

3. The flux according to claim 1 wherein the activator, vehicle and hydrophobic surfactant are dissolved in a solvent.

4. The flux according to claim 3 wherein the solvent comprises isopropyl alcohol.

5. The flux according to claim 2 wherein the inert oil is selected from the group consisting of tall oil and mineral oil.

6. The flux according to claim 2 wherein the inert oil comprises rosin in an amount not greater than 1% by weight of the flux.

7. The flux according to claim 1, wherein the hydrophobic surfactant is selected from the group of mono-, di-, tri-alkyl and -aryl phosphate esters and mixtures thereof.

8. The flux according to claim 7 wherein the hydrophobic surfactant is chosen from the group consisting of straight or branched carbon chain containing an alkyl group in which the molecular weight of the alkyl chain is greater than 48.

9. The flux according to claim 8 wherein the hydrophobic surfactant is chosen from the group consisting of straight or branched carbon chains containing an aryl group in which the molecular weight of the aryl chain is greater than 189.

10. The flux according to claim 8 wherein the hydrophobic surfactant is chosen from the group consisting of straight or branched carbon chains containing an alkyl group and/or aryl groups in which the chain is connected to a phosphate group by an oxide selected from one of the group of polypropylene and polyethylene oxides.

11. The flux according to claim 8 wherein the hydrophobic surfactant comprises 0.5-7.1% by weight of the flux.

12. The flux according to claim 1 wherein the activator is selected from the group consisting of an organic acid and metal complexing material and an organoamine hydrohalide.

13. A water-soluble soldering flux, which, when applied to a circuit board, does not degrade the surface insulation resistance of the board following the soldering and subsequent cleaning thereof, comprising:
    10-50% water-soluble vehicle;
    0-20% by weight of an activator; and
    0.5-7.1% by weight of a hydrophobic surfactant which is preferentially adsorbed by the surface of the circuit board over the vehicle and the activator to render the surface substantially hydrophobic.

14. The flux according to claim 13 further including a solvent in which the vehicle, hydrophobic surfactant and activator are dissolved.

15. The flux according to claim 13 further including an inert mineral oil comprising 0-2% by weight of the flux.

16. A method of fabricating a circuit board having metallized areas on at least one of its major surfaces, comprising the steps of:
    conformally applying a photodefinable layer to a major surface of a circuit board having at least one metallized area thereon:
    patterning the film by photolithography to expose at least a portion of the metallized area:
    applying a water-soluble flux, comprised of a water-soluble vehicle, activator, and a hydrophobic surfactant which is preferentially adsorbed by the surface of the circuit board over the vehicle and the activator to wet and clean the exposed portion of the metallized area while simultaneously rendering the board surface substantially hydrophobic by the preferential adsorption by the board surface of the hydrophobic surfactant;
    applying solder to the exposed, flux-coated portion of the metallized area; and
    aqueously cleaning the circuit board to remove flux residues.

17. A method of fabricating a circuit board having metallized areas on at least one of its major surfaces, comprising the steps of:
    conformally applying a photodefinable layer to a major surface of a circuit board having at least one metallized area thereon:
    patterning the film by photolithography to expose at least a portion of the metallized area;
    electroplating the exposed portion of the metallized area with solder;
    applying a water-soluble flux, comprised of a water-soluble vehicle, activator, and a hydrophobic surfactant preferentially adsorbed by the surface of the circuit board over the vehicle and solvent to wet and clean the metallized area while simultaneously rendering the board surface substantially hydrophobic by the preferential adsorption by the surface of the hydrophobic surfactant;
    reflowing the electroplated solder by the application of heat; and
    aqueously cleaning the circuit board to remove flux residues.

18. A method for soldering a component to a circuit board comprising the steps of:
    placing a component on a circuit board such that the components has each of its leads in contact with a corresponding metallized area on the circuit board;
    applying a water-soluble flux, comprised of a water-soluble vehicle, activator, and a hydrophobic surfactant preferentially adsorbed by the surface of the circuit board over the vehicle and solvent to wet and clean the metallized area while simultaneously rendering the board surface substantially hydrophobic by the preferential adsorption by the surface of the hydrophobic surfactant;
    applying solder to the flux-coated metallized areas; and
    aqueously cleaning the circuit board to remove flux residues.

* * * * *